United States Patent
Otremba (10) Patent No.: US 7,271,470 B1
(45) Date of Patent: Sep. 18, 2007

(54) ELECTRONIC COMPONENT HAVING AT LEAST TWO SEMICONDUCTOR POWER DEVICES

(75) Inventor: Ralf Otremba, Kaufbeuren (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 11/421,297

(22) Filed: May 31, 2006

(51) Int. Cl.
*H01L 23/495* (2006.01)

(52) U.S. Cl. .............. 257/666; 257/676; 257/723; 438/123

(58) Field of Classification Search .......... 257/666, 257/676, 723; 438/123
See application file for complete search history.

(56) References Cited

U.S. PATENT DOCUMENTS

| | | | |
|---|---|---|---|
| 5,998,857 A * | 12/1999 | Tzu | 257/670 |
| 6,423,623 B1 | 7/2002 | Bencuya et al. | 438/612 |
| 6,677,669 B2 | 1/2004 | Standing | 257/685 |
| 6,696,321 B2 | 2/2004 | Joshi | 438/111 |
| 6,762,067 B1 * | 7/2004 | Quinones et al. | 438/11 |
| 6,841,869 B1 * | 1/2005 | Triantafyllou et al. | 257/723 |
| 6,919,643 B2 | 7/2005 | Wheeler et al. | 257/778 |
| 6,949,822 B2 | 9/2005 | Shivkumar et al. | 257/704 |
| 7,109,576 B2 * | 9/2006 | Bolken et al. | 257/686 |
| 2004/0159939 A1 | 8/2004 | Joshi | 257/723 |

* cited by examiner

*Primary Examiner*—Roy Potter
(74) *Attorney, Agent, or Firm*—Banner & Witcoff, Ltd.

(57) ABSTRACT

An electronic component includes at least two vertical semiconductor power devices and an electrically conductive contact clip. Each vertical semiconductor device has a first side with at least one first lead electrode and a second side opposing the first side with at least one second load electrode. The contact clip comprises a flat web portion and at least one peripheral rim portion extending from an edge region of the flat web portion. Each of the at least two vertical semiconductor power devices is attached, and electrically connected to, the lower surface of the flat web portion of the contact clip.

25 Claims, 3 Drawing Sheets

ELECTRONIC COMPONENT HAVING AT LEAST TWO SEMICONDUCTOR POWER DEVICES

TECHNICAL FIELD

The application relates to an electronic component, and in particular to an electronic component comprising at least two semiconductor power devices.

BACKGROUND

Electronic boards for current and voltage supply applications such as AC/DC and DC/DC converters are typically provided with a number of active and passive electronic component mounted adjacent one another on a substrate such as a circuit board. Typically, a number of semiconductor power switches, such as Power MOSFET (Metal Oxide Semiconductor Field Effect Transistor) devices, gate driver chips and at least one pulsed width modulator chip are mounted on a single circuit board. A rewiring structure is also provided between the various devices on the circuit board.

Generally, increasingly smaller electronic devices with an increasingly higher performance are desired. At the same time, it is desired to improve the reliability and to reduce the size and cost of the both electronic components themselves as well as the article in which they are used, such the electronic board.

This has lead to the development of electronic components in which two or more semiconductor devices are packaged in a single component housing. Such components are often referred to as multi-chip modules. However, since each semiconductor device produces heat, the increasing density of semiconductor devices increases the complexity of effectively dissipating the heat so as not to impede the performance of the multi-chip module and the overall performance delivered by the board. Further reductions in the size and cost of multi-chip modules as well as in the thermal performance are desirable.

SUMMARY

An electronic component may comprise at least two semiconductor devices, an electrically conductive contact clip, a plurality of surface mountable outer contact surfaces and a leadframe. Each vertical semiconductor device comprises a first side and a second side opposing the first side. At least one first load electrode is positioned on the first side and at least one second load electrode is positioned on the second side. The contact clip comprises a flat web portion and at least one peripheral rim portion extending from an edge region of the flat web portion in a direction towards the lower side of the flat web portion. The leadframe comprises a lower surface providing surface mountable outer contact surfaces and an upper surface and provides at least two die support portions. Each of the at least two vertical semiconductor power devices is positioned between the upper surface of the leadframe and the lower surface of the flat web portion of the contact clip and is attached to, and electrically connected to, the upper surface of the leadframe and is attached to and electrically connected to the lower surface of the flat web portion of the contact clip.

An electronic component may comprise a base component and at least one stack component. The base component may comprise at least two base vertical semiconductor power devices, an electrically conductive base contact clip and a plurality of outer contact surfaces. Each base vertical semiconductor device comprises a first side and a second side opposing the first side. At least one first load electrode is positioned on the first side and at least one second load electrode is positioned on the second side of each base vertical semiconductor power device. The base contact clip comprises a base flat web portion and at least one base peripheral rim portion. The base flat web portion has a lower side and an upper side and a base peripheral rim portion extends from an edge region of the base flat web portion in a direction towards the lower side of the base flat web portion. Each of the at least two base vertical semiconductor power devices is attached to, and electrically connected to, the lower surface of the base flat web portion of the base contact clip. The stack component comprises at least two stack vertical semiconductor power devices. Each stack vertical semiconductor device comprises a first side and a second side opposing the first side. At least one first load electrode is positioned on the first side and at least one second load electrode is positioned on the second side. Each of the stack vertical semiconductor power devices is attached to, and electrically connected to, the upper surface of the base contact clip of the base component.

A method may comprise providing at least two base vertical semiconductor power devices. Each base vertical semiconductor device comprises a first side and a second side opposing the first side. At least one first load electrode is positioned on the first side and at least one second load electrode is positioned on the second side. An electrically conductive base contact clip is provided which comprises a base flat web portion and at least one base peripheral rim portion. The base flat web portion has a lower side and an upper side and a base peripheral rim portion extends from an edge region of the base flat web portion in a direction towards the lower side of the base flat web portion. A plurality of surface mountable outer contact surfaces is provided. Each of the at least two base vertical semiconductor power devices is attached and electrically connected to the lower surface of the base flat web portion of the base contact clip. At least two stack vertical semiconductor power devices are provided. Each stack vertical semiconductor device comprises a first side and a second side opposing the first side. At least one first load electrode is positioned on the first side and at least one second load electrode is positioned on the second side. Each of the stack vertical semiconductor power devices is attached to and electrically connected to the upper surface of the base contact clip of the base component.

DETAILED DESCRIPTION

In an embodiment, an electronic component comprises at least two vertical semiconductor power devices, an electrically conductive contact clip, a plurality of surface mountable outer contact surfaces and a leadframe.

Each vertical semiconductor device comprises a first side and a second side opposing the first side. At least one first load electrode is positioned on the first side and at least one second load electrode is positioned on the second side of each of the vertical semiconductor devices.

The contact clip comprises a flat web portion and at least one peripheral rim portion extending from an edge region of the flat web portion in a direction towards the lower side of the flat web portion. The leadframe comprises a lower surface providing surface mountable outer contact surfaces and an upper surface and provides at least two die support portions.

Each of the at least two vertical semiconductor power devices is positioned between the upper surface of the leadframe and the lower surface of the flat web portion of the contact clip. Each of the at least two vertical semiconductor power devices is attached to, and electrically connected to, the upper surface of the leadframe and is attached to and electrically connected to the lower surface of the flat web portion of the contact clip.

In this context, "upper" and "lower" are used to refer to the surface which faces away from or towards, respectively, the printed circuit board (PCB) on which the electronic component will be mounted. The surface mountable outer contact surfaces of the electronic component board are in direct surface to surface contact with the printed circuit board and are, therefore, denoted as lower outer contact surfaces.

The surface of the leadframe which is mounted on the PCB is denoted as the "lower" surface. The opposing surface of the leadframe is, therefore, referred to as the "upper" surface of the leadframe. Similarly, the lower surface of the flat web portion of the contact clip faces towards the printed circuit board and in the same direction as the surface mountable outer contact surfaces. The upper surface of the flat web portion of the contact clip, therefore, opposes the lower surface of the flat web portion of the contact clip and faces upwards away from the printed circuit board and away from the surface mountable outer contact surfaces of the electronic component.

An electronic component is provided in which at least two vertical semiconductor power devices are mounted adjacent one another on the lower surface of the electrically conductive contact clip. The load electrodes of the two vertical semiconductor power devices attached to the lower surface of the contact clip are, therefore, electrically connected in series by the electrically conductive contact clip and lie at the same potential.

The opposing surface of each of the two vertical semiconductor power devices is mounted on, and electrically connected to, the upper surface of the leadframe. The two vertical semiconductor power devices are, therefore, sandwiched directly between the conductive clip and the leadframe. The leadframe and the contact clip each comprise copper. An electronic component is, therefore, provided with two electrically conductive rewiring structures enabling the two opposing sides of the vertical semiconductor power devices to be electrically accessed. Each rewiring structure may provide a different electrical connection between the semiconductor devices.

The leadframe comprises two die support regions on which the vertical semiconductor power devices are mounted. The lower surface of each of the two die support portions of the leadframe provide surface mountable outer contact surfaces of the electronic component. The arrangement of the die support regions, the choice of vertical semiconductor power device and the relative positioning of the vertical semiconductor power devices on the die support portions enables different electrical circuits to be provided.

The provision of two types of rewiring within the electronic component simplifies the design of the board on which the component is mounted and simplifies the mounting process.

The contact clip may provide a single electrical contact to one side of the vertical semiconductor power devices while the leadframe may provide a rewiring structure by which a load electrode of each of the vertical semiconductor power devices may be electrically accessed independently of the other semiconductor power devices.

The leadframe may provide a single electrical contact to the lead electrode of two or more vertical semiconductor devices while the contact clip also provides a single electrical contact to the opposing electrode of the two or more vertical semiconductor devices.

The leadframe and contact clip have a generally planar form. The electronic component, therefore, provides a multi-chip module in which the rewiring structure between the two opposing sides of at least two vertical semiconductor power switches and the surface mountable outer surfaces of the electronic component is compact. The impedance provided by the rewiring structure is low so that the performance of the electronic component, in particular, the switching capability, is improved.

In an embodiment, a plurality of electrically conductive bumps, which may comprise copper, are provided on the electrode or electrodes positioned on the first side of the vertical semiconductor power devices. The first side of the vertical semiconductor power device may be mounted on the upper surface of the die support portions of the leadframe by the electrically conductive bumps.

The electrically conductive bumps have a height so that the first surface of the vertical semiconductor power devices is spaced at a distance from the upper surface of the leadframe to which it is attached. This improves the thermal performance of the component since the heat generated by the device tends to be dissipated upwards by the contact clip rather than downward into the substrate on which it is mounted. Heat is more effectively dissipated from the upper surface of the component and further improvements can be gained by providing an additional heat dissipater on the upper surface of the contact clip.

The electronic component may also be provided with a plastic encapsulation compound which encapsulates at least the vertical semiconductor power devices. In an embodiment, the plastic encapsulation compound may encapsulate the vertical semiconductor power devices, the upper surface of the leadframe and peripheral rim portions of contact clip. The flat web portion of the contact clip or at least a region of the flat web portion of contact clip as well as the lower surface of the lead frame may remain uncovered by the plastic encapsulation compound.

In further embodiments, the leadframe may be omitted from the electronic component. The load electrodes on the side of the vertical semiconductor power devices not mounted on the contact clip may provide surface mountable outer contact surfaces of the electronic component. Alternatively, a plurality of contact bumps, which may be provided in the form of solder balls, may be provided on the side of the vertical semiconductor power devices not mounted on the contact clip. The plurality of contact bumps, therefore, provides surface mountable outer contact surfaces of the electronic component.

In an embodiment, the second load electrode of each vertical semiconductor power device may be attached to the lower surface of the flat web portion of the contact clip. The second load electrodes of the two semiconductor power devices are, therefore, electrically connected in a series by the contact clip. The first side of each semiconductor power device is, therefore, attached to the upper side of the leadframe, in particular, to the upper side of the die support portions of the leadframe.

In an embodiment, the first vertical semiconductor power device is a transistor and the second vertical semiconductor power device is a diode. The transistor may be a power MOSFET or and IGBT (Isolated Gate Bipolar Transistor) device. The first side of the transistor further comprises at least one control electrode in addition to the first load electrode. In a power MOSFET device, the first load electrode is a source, the second load electrode is a drain and the controlled electrode is a gate. For an IGBT device, the first load electrode is an emitter, the second load electrode is a collector and the control electrode is a gate. The second vertical semiconductor power device may be a diode, a freewheeling diode or a Schottky diode. The diode may be electrically connected in series with the transistor or in parallel with the transistor, as in the case of a freewheeling diode. The Schottky diode may be connected in series with the transistor.

The arrangement of the transistor and diode on the leadframe may, therefore, be chosen so as to provide the desired electrical circuit and, therefore, function of the electronic component. If the diode is to be connected in parallel with the transistor, both the anode electrode of the diode and the source electrode of the transistor are mounted on the same portion of the leadframe and the cathode electrode of the diode and the drain electrode of the transistor are mounted on a single contact clip.

If the diode is to be connected in series with the transistor, be and eight electrode of the diode and the source electrode of the transistor are mounted onto different portions of the leadframe while the cathode electrode of the diode and the drain electrode of the transistor are both mounted on the same contact clip.

The first vertical semiconductor power transistor may be arranged so that its second load electrode is mounted on the flat web portion of the contact clip and its first load electrode and its gate electrode are each mounted on two physically separate die support regions of the leadframe. This enables the gate electrode and the source electrode to be independently electrically accessed.

In an embodiment, two vertical semiconductor power transistors are provided. Each vertical semiconductor power transistor may be a MOSFET device or an IGBT device. Each vertical power transistor, therefore, further comprises at least one control electrode on its first side.

If two vertical semiconductor power transistors are provided in the electronic component, the first vertical semiconductor power device and the second vertical semiconductor power device may be configured to produce a half-bridge circuit.

The first vertical semiconductor power device may be an n-channel device, such as an n-channel MOSFET, and the second vertical semiconductor power device may be a p-channel device, such as a p-channel MOSFET.

An n-channel MOSFET and a p-channel MOSFET may be used to provide a half-bridge circuit since the drain electrode of the n-channel MOSFET and the p-channel MOSFET lie at the same potential in a half-bridge circuit. Therefore, the drain electrode of the n-channel MOSFET and p-channel MOSFET may be electrically connected in series by mounting the second side of the n-channel MOS-FET on the contact clip and by mounting the second side of the p-channel MOSFET on the contact clip adjacent to the n-channel MOSFET.

The source electrode of the n-channel MOSFET lies at ground potential so the n-channel device provides the low side switch of the half-bridge circuit. The source electrode of the p-channel MOSFET device is connected to a high potential so the p-channel device provides the high side switch of the half-bridge circuit. The source electrode of the n-channel MOSFET and of the p-channel MOSFET are mounted on separate portions of the leadframe which enables the source electrode of each of the MOSFET devices to be electrically accessed independent of one another via these separate portions of the leadframe.

An electronic component which comprises two vertical semiconductor power transistors may further comprise a Schottky diode. The Schottky diode may be configured in parallel with the second vertical semiconductor power device. The Schottky diode may, therefore, be electrically connected in parallel with the n-channel MOSFET if a half bridge circuit is provided, as described above, by an n-channel MOSFET and a p-channel MOSFET.

The electrically conductive contact clip may comprise at least two peripheral rim portions extending from two edge regions of the flat web portion. In an embodiment, the flat web portion of the contact clip is laterally generally rectangular and a peripheral within portion extends form each of the two short sides of the flat web portion. Each peripheral rim portion extends directions towards the lower surface of the flat web portion and extends into a foot region.

The contact clip may also be described as a can with peripheral walls extending upwards to provide a volume in which at least two vertical semiconductor power devices may be accommodated. The two vertical semiconductor power devices may be mounted on the base of the can adjacent one another. The can, if it is provided with two peripheral rim portions extending from two opposing sides of a rectangular flat web portion, is open on two opposing sides.

In an embodiment, the foot region of each of the peripheral rim portions has a lower surface which provides a surface mountable outer contact surface. The lower surface of the foot region is, therefore, substantially coplanar with the other surface mountable outer contact surfaces. If a leadframe is provided, the lower surface of the foot region is, therefore, generally coplanar with the lower surface of the leadframe.

If the first load electrodes of the vertical semiconductor devices provide surface mountable outer contact surfaces, the lower surface of the foot region is generally coplanar with the outermost surface of the first load electrode. Similarly, if contact bumps are provided on the first surface of the vertical semiconductor power devices, the lower surface of the foot region is generally coplanar with the outermost surface of the contact bumps.

The lower surface of the foot region of the contact clip is arranged adjacent the outwardly facing side face of the vertical semiconductor power device. If two peripheral rim portions are provided which extend on opposing sides of the flat web portion, the vertical semiconductor power devices are positioned between the two peripheral rim portions and between the two foot regions.

In further embodiment, the leadframe further comprises two outer portions in addition to the at least two die support portions. One outer portion is positioned adjacent each of the outermost side faces of the die support regions. The die support regions are positioned directly between the two outer portions of the leadframe. The foot region of one peripheral rim portion is attached to, and electrically connected to, one of the outer portions of the leadframe and the foot region of the second peripheral rim portion is attached to, connected to, the second outer portion of the leadframe. In this embodiment, the lower surface of the foot region is generally coplanar with the upper surface of the leadframe and, consequently, the outermost surface of the first load electrode.

The vertical semiconductor power devices may be mounted on the contact clip by diffusion solder, soft solder or electrically conductive adhesive. Diffusion solder provides a thermally stable mechanical and electrical connection since the diffusion solder bond formed from the diffusion solder comprises intermetallic phases which have a high melting point than the melting point of the diffusion solder. The diffusion solder bond also remains mechanically stable at temperatures typically used for soft soldering. The diffusion solder bond is suitable for assembly processes in which two or more die attach processes are carried out sequentially.

The electronic component may be assembled by attaching the first side of the vertical semiconductor power devices by diffusion solder bond to the upper surface of the lead frame. The contact clip may be mounted on second surface of the vertical semiconductor power devices after the diffusion solder process by a soft solder joint.

An electronic component may comprise a base component with at least two vertical semiconductor power devices and a contact clip and at least one stack component with a further two vertical semiconductor power devices. The stack component is positioned on the base component.

The base component may comprise at least two base vertical semiconductor power devices, an electrically conductive base contact clip and a plurality of surface mountable outer contact surfaces. Each base vertical semiconductor device comprises a first side and a second side opposing the first side. At least one first load electrode is positioned on the first side and at least one second load electrode is positioned on the second side of each base vertical semiconductor power device.

The base contact clip comprises a base flat web portion and at least one base peripheral rim portion. The base flat web portion has a lower side and an upper side and a base peripheral rim portion extends from an edge region of the base flat web portion in a direction towards the lower side of the base flat web portion. Each of the at least two base vertical semiconductor power devices is attached to, and electrically connected to, the lower surface of the base flat web portion of the base contact clip.

The stack component comprises at least two stack vertical semiconductor power devices. Each stack vertical semiconductor device comprises a first side and a second side opposing the first side. At least one first load electrode is positioned on the first side and at least one second load electrode is positioned on the second side.

Each of the stack vertical power devices is attached to, and electrically connected to, the upper surface of the base contact clip of the base component.

A stack electronic component is provided in which each of the base vertical semiconductor power devices is mounted on the lower surface of the base contact clip and each of the stack vertical semiconductor devices is attached to the upper surface of the base contact clip. The base contact clip, therefore, provides a single shared electrical contact to one side of each of the vertical semiconductor power devices of the base component and of the stack component. The base contact clip, therefore, provides a compact rewiring structure by which the respective load electrodes of the semiconductor power devices of both the base component and the stack component may be accessed.

The space occupied by the electronic component with a base component and stack component mounted on the base component is further reduced. Consequently, either the size of the sub-assembly board on which the component is mounted may be reduced or the performance of a sub-assembly of the same size may be increased by mounting additional devices on the board in the regions made available by use of the stacked electronic component.

In an embodiment, the second load electrode of each of the two base vertical semiconductor power devices is mounted on, and electrically connected to, the lower surface of the base flat web portion of the base contact clip and the second load electrode of each of the stack vertical semiconductor power devices is mounted on, and electrically connected to the opposing upper surface of the flat web portion of the base contact clip. The second load electrodes of each of the base and stack vertical semiconductor power devices lie at the same potential.

The first load electrode of each of the stack semiconductor power devices may be electrically accessible from the surface mountable outer contact surfaces of the base component. The first load electrodes of each of the stack semiconductor devices may be electrically accessed separately or by a shared electrical contact depending on the power devices provided and the desired electrical circuit. The electrical contact or electrical contacts may be provided by stack contact clips.

In an embodiment, the electronic component further comprises at least two stack contact clips. Each stack contact clip comprises a flat web portion and a peripheral rim portion which extends from one edge region of flat web portion in a direction towards the lower surface of the flat web portion. The general form of the stack contact clip may be similar to the general form of the base contact clip.

The flat web portion of a single stack contact clip may be mounted on the first load electrode of each of the stack vertical semiconductor power devices. Each of the first load electrodes of the stack vertical semiconductor power devices may be electrically accessed independently of the others.

Alternatively, the flat web portion of one stack contact clip may be mounted on the first load electrode of two or more stack vertical semiconductor power devices electrically connecting them. In this embodiment, the first load electrode of the two or more stack vertical semiconductor devices is accessed by a shared electrical contact and lies at the same potential.

The peripheral rim portion of each stack contact clip may extend into a foot region. The foot region may have a lower surface which provides a surface mountable outer contact surface. Therefore, the lower surface of the foot region of the stack rueful rim portion lies in generally the same plane as the surface mountable outer contact surfaces of the base component.

An electronic component may, therefore, be provided in which the lower surface of the foot region of the stack peripheral rim portions and of the base peripheral rim portions lie in generally the same plane. Further surface mountable outer contact surfaces may be provided by the outermost surfaces of load electrodes of the base vertical semiconductor power devices, by the lower surface of die support portions of the leadframe on which the base vertical semiconductor power devices are mounted or by the outermost surfaces of contact bumps which are positioned on the load electrodes of the base vertical semiconductor power devices not mounted on the base contact clip.

In an embodiment, the base component further comprises a leadframe. The leadframe has a lower surface providing surface mountable outer contact surfaces and an upper surface. The leadframe further comprises at least two die support portions on which the base vertical semiconductor power devices are mounted. The base vertical semiconductor power devices are therefore sandwiched directly between the upper surface of the die support portions of the leadframe and the lower surface of the base contact clip.

If a leadframe is provided, the base contact clip may comprise one or more peripheral rim portions with a foot region whose lower surface lies in generally the same plane as the lower surface of the leadframe. Alternatively, the leadframe may comprise two further outer portions and the base contact clip may comprise one or more peripheral rim portions each with a foot region which is mounted on the upper surface of an outer portion of the leadframe.

If a leadframe is provided, the one or more stack contact clips may be provided with a peripheral rim portion having a foot region which is generally coplanar with the lower surface of the die support regions of the leadframe.

Alternatively, the leadframe may be provided with stack contact portions. The stack contact clip is, therefore, provided with a form so that the lower surface of the foot region is generally coplanar with the upper surface of the leadframe. This enables the first load electrodes of the stack component, which are electrically connected to the flat web portion of the stack contact clips, to be electrically accessed from the leadframe which provides the surface mountable outer contact surfaces from which the vertical semiconductor power devices of the base component as well as of the stack component may be accessed.

The base component may comprise a power transistor and a diode. A first base vertical semiconductor power device may be a power MOSFET or an IGBT, in which case the first side further comprises at least one control electrode. A second base vertical semiconductor power device may be a diode, a free-wheeling diode or a Schottky diode. The diode may be electrically connected in a series with the transistor or in parallel with the transistor as is the case with a freewheeling diode.

The stack component may also comprise a power transistor and a diode. A first stack vertical semiconductor power device may be a power MOSFET or an IGBT, in which case the first side further comprises at least one control electrode. A second stack vertical semiconductor power device may be a diode, a free-wheeling diode and a Schottky diode. The diode may be electrically connected in series or in parallel with the transistor.

An electronic component may be provided in which the base component and the stack component each comprise a power transistor and a diode. The transistor and the diode of each of the base component and of the stack component may have the same electrical configuration.

The base component may comprise two vertical semiconductor power transistors. The first base vertical semiconductor power device may be a power MOSFET or an IGBT, first side further comprising at least one control electrode, and the second base vertical semiconductor power device may be a power MOSFET or an IGBT, the first side further comprising at least one control electrode.

The two vertical semiconductor power devices of base component may be configured so as to provide a half-bridge circuit. One base vertical semiconductor power transistor may be an n-channel device and a second base vertical semiconductor power transistor may be a p-channel device.

The stack component may also comprise two power transistors. The first stack semiconductor power device may be a power MOSFET or an IGBT and the second stack semiconductor power device may be a power MOSFET or an IGBT. The first side of the first stack semiconductor power device and the first side of the second stack semiconductor power device further comprises at least one control electrode.

The two transistors of the stack component may also be configured so as to provide a half-bridge circuit. The half-bridge circuit of the stack component may also be provided by an n-channel transistor and a p-channel transistor.

If two transistors are provided in the stack component, the stack component may be further provided with two stack contact clips, one for each of the two control electrodes. This enables each of the control electrodes of the stack transistors to be independently controlled.

A method of assembling an electronic component may comprise providing at least two base vertical semiconductor power devices. Each base vertical semiconductor power device comprises a first side and a second side opposing the first side. At least one first load electrode is positioned on the first side and at least one second load electrode is positioned on the second side of each base vertical semiconductor power device.

An electrically conductive base contact clip is provided which comprises a base flat web portion and at least one base peripheral rim portion. The base flat web portion has a lower side and an upper side and a base peripheral rim portion extends from an edge region of the base flat web portion in a direction towards the lower side of the base flat web portion.

A plurality of surface mountable outer contact surfaces is provided.

Each of the at least two base vertical semiconductor power devices is attached, and electrically connected to, the lower surface of the base flat web portion of the base contact clip.

At least two stack vertical semiconductor power devices are provided. Each stack vertical semiconductor device comprises a first side and a second side opposing the first side. At least one first load electrode is positioned on the first side and at least one second load electrode is positioned on the second side of each of the stack vertical semiconductor power devices.

Each of the stack vertical power devices is attached, and electrically connected to, the upper surface of the base contact clip of the base component.

The second load electrode of each of the base vertical semiconductor devices may be mounted on the lower surface of the flat web portion of the base contact clip and the second load electrode of each of the stack vertical semiconductor devices may be mounted on the upper surface of the flat web portion of the base contact clip. This may be carried out by arranging the second load electrode of each of the base vertical semiconductor devices on the lower surface of the flat web portion of the base clip and attaching the base vertical semiconductor devices to the lower surface of flat web portion of the base clip. In the subsequent process, the second load electrode of the stack vertical semiconductor devices may be arranged on the upper surface, and attached to, the upper surface of the flat web portion of the base contact clip.

In an embodiment, each vertical semiconductor power device of both the base component and stack component may be mounted on the base contact clip in a separate attachment process.

The second load electrode of each of the base vertical semiconductor devices may be attached to the lower surface of the flat web portion of the base contact clip by a diffusion solder process forming diffusion solder bonds. The second load electrode of each of the first stack vertical semiconductor devices may be also attached to the upper surface of the flat web portion of the base contact clip by a diffusion solder process to form a diffusion solder bond. If a diffusion solder process is used, a layer of diffusion solder may be provided on the outermost surface of the second load electrode of each of the vertical semiconductor power devices which are to be attached to the base contact clip.

A diffusion solder bond may be formed by heating the base contact clip to a temperature above the melting point of the diffusion solder which is positioned on the outermost surface of the second load electrode of the base vertical semiconductor power devices. The layer of diffusion solder is brought into surface to surface contact with the lower surface of the flat web portion of the base contact clip. Intermetallic phases are formed between the elements of the diffusion solder and the material of the base contact clip. These intermetallic phases have a melting point which is higher than the melting point of the diffusion solder. Therefore, the mechanical and electrical joint is formed by the solidification of the interface between the diffusion solder and the contiguous materials to form a diffusion solder bond.

In an embodiment, soft solder or an electrically conductive adhesive may be used to attach the vertical semiconductor power devices to the base contact clip instead of a diffusion solder process.

The phrase "diffusion solder bond" is used in this context to denote a connection structure which is mechanically and electrically attached to a contiguous surface by a layer comprising intermetallic phases. The intermetallic phases are formed as a result of a diffusion soldering process and comprise chemical elements of a diffusion solder and of at least one contiguous material of the surface to which it is attached.

The diffusion solder bond formed in the first stage is thermally and mechanically stable during the second bonding process so that the melting of the already formed joint is avoided. This order of carrying out the method steps prevents movement between the base vertical semiconductor power devices and the base contact clip during the joining of the stack semiconductor power devices to the upper surface of the base contact clip.

The diffusion solder layer may comprise Sn and one of the group consisting of Ag, Au, Cu and In or may comprise Au and Si or Ag and In. The diffusion solder layer may have a thickness b, where $0.1\ \mu m \leq b \leq 10\ \mu m$. The thickness of the diffusion solder bond which is formed from the diffusion solder layer is approximately the same as the layer of diffusion solder initially deposited.

In an embodiment, a leadframe is provided, the leadframe comprising a lower surface providing surface mountable outer contact surfaces and an upper surface and at least two die support portions. The base vertical semiconductor power devices are attached to, and electrically connected to, the upper surface of the die support portions of the leadframe.

The first side of the base vertical semiconductor power devices may be attached to the upper surface of the die support portions of the leadframe by a diffusion solder bond, soft solder or an electrically conductive adhesive. The first side of the base vertical semiconductor power devices may be attached to the leadframe before the contact clip is attached to the second side of the base vertical semiconductor devices. In this case, the first side of the base vertical semiconductor power devices may be attached to the leadframe by a diffusion solder bond and the base contact clip may, afterwards, be attached to the second side of the base vertical semiconductor power devices by a soft solder joint or by electrically conductive adhesive. The diffusion solder bonds have a higher melting point than the temperature at which the soft solder joint or electrically conductive adhesive joint is produced. Therefore, the joint already formed remains mechanically stable during the second attachment process.

At least two stack contact clips may be provided. Each stack contact clip may comprise a flat web portion and a peripheral rim portion extending from one edge region of the flat web portion in a direction towards the lower surface of the flat web portion.

A stack contact clip is mounted on at least the first load electrode of the first and of second stack vertical semiconductor power devices. The first load electrode of the first and second vertical semiconductor power devices are electrically accessible from surface mountable outer contact surfaces of the electronic component. This may be provided by selecting in the form of the stack contact clips so that the lower surface of the foot region of the peripheral rim portion of the stack contact clip is in generally the same plane as the surface mountable outer contact surfaces and, therefore, itself provides a surface mountable outer contact surface.

Alternatively, a leadframe may be provided which includes stack contact portions and the stack contact clips provided with a form such that the lower surface of the foot region may be mounted on the upper surface of the stack contact portion of the leadframe when the lower surface of the flat web portion is mounted on the first load electrode of the stack vertical semiconductor power device.

A single stack contact clip is, therefore, mounted on the first load electrode of both the first and second vertical semiconductor power devices. The first load electrode of the first and of the second vertical semiconductor power devices is accessed by a shared contact, in this case a single stack contact clip, and lies at the same potential. The first load electrode of the first vertical semiconductor power device and of the second semiconductor power device are, therefore, electrically connected in series.

Figure 1:
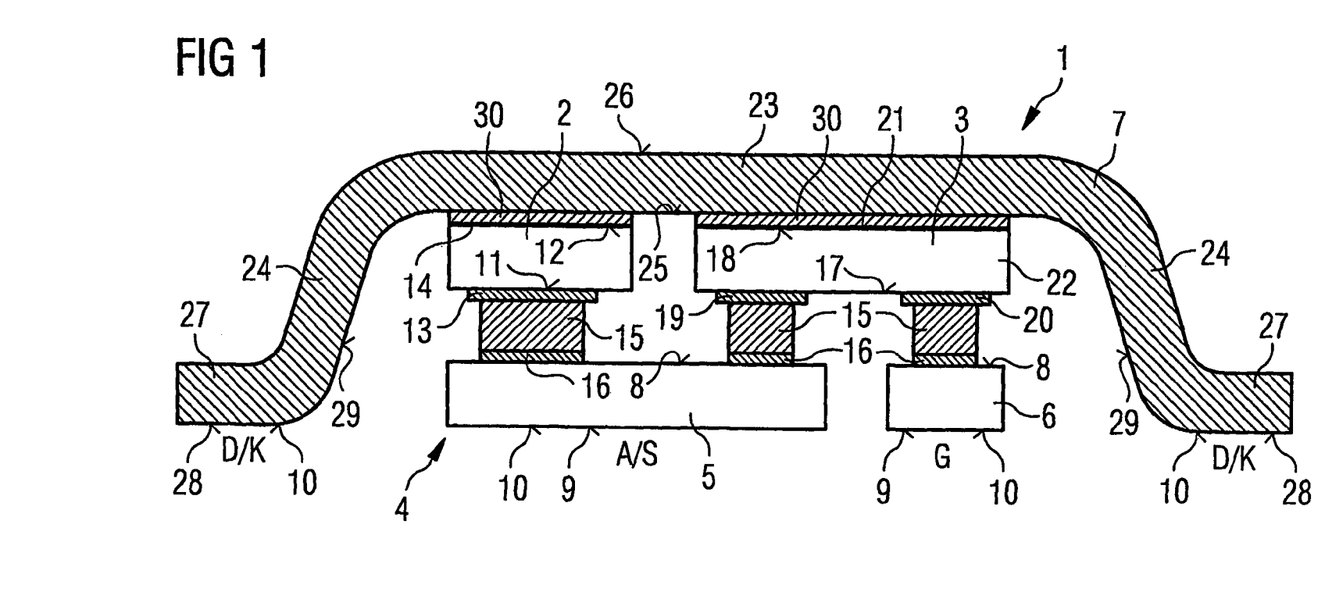
FIG. 1 illustrates an electronic component according to a first embodiment.

FIG. 1 illustrates an electronic component 1 comprising two vertical semiconductor power devices 2, 3 according to a first embodiment. The electronic component 1 further comprises a leadframe 4 comprising copper which provides to die support regions 5, 6 and a contact clip 7 also comprising copper.

The leadframe 4 comprises a first die support region 5 which is laterally larger than the second die support region 6. The two die support regions 5, 6 are positioned adjacent to one another and at a distance from one another. The two die support regions 5, 6 are, therefore, not physically in contact with one another. Each die support region 5, 6 has an upper surface 8 on which the vertical semiconductor devices 2, 3 are mounted and an opposing lower surface 9 which provides surface mountable outer contact surfaces 10 of the electronic component 1.

The first vertical semiconductor power device 2 is a diode which comprises a first surface 11 and a second surface 12. An anode 13 is positioned on the first surface 11 of the diode 2 and extends across the majority of the first surface 11. The opposing upper surface 12 of the diode 2 comprises a cathode 14 which also extends over the majority of the surface area of the second side 12.

An electrically conductive metal contact bump 15, which comprises copper, is positioned on the anode electrode 12. The diode 2 is mounted on the upper surface 8 of the first die support portion 5 of the leadframe 4 by a diffusion solder bond 16 which is positioned directly between the outermost surface of the contact bump 15 and the upper surface 8 of the first die support portion 5. The vertical diode 2 is positioned towards an outer edge region of the upper surface 8 of the first die support region 5 which, in the view of the electronic component 1 illustrated in FIG. 1, is towards the lefthand side of the first die support portion 5. The contact bump 15, therefore, spaces the first lower surface 11 of the diode 2 at a distance from the upper surface 8 of the leadframe 4.

The second vertical semiconductor power device 3 is a MOSFET transistor device which has a first surface 17 and a second surface 18 which opposes the first surface 17. A source electrode 19 and gate electrode 20 are positioned on the first surface 17 and a drain electrode 21 is positioned on the second surface 18 of the MOSFET device 3. A plurality of contact bumps 15 is positioned on the source electrode 19 and a single contact bump 15 is positioned on the gate electrode 20.

The vertical MOSFET device 3 is mounted on the leadframe 4 so that the contact bump 15 positioned on the source electrode 19 is mounted on the first die support region 5 and the contact bump 15 of the positioned on the gate electrode 20 is positioned on the second die support portion 6 of the leadframe 4. The semiconductor body 22 of the MOSFET device 3, therefore, extends between the two die support portions 5, 6.

Each contact bump 15 is mounted on the upper surface 8 of its respective portion 5, 6 of the leadframe 4 by a diffusion solder bond 16. The first surface 17 of the MOSFET device 3 is, therefore, spaced at a distance from the upper surface 8 of the leadframe 4 due to the contact bumps 15. The drain electrode 21, therefore, faces upwards away from the leadframe 4.

Since the anode 13 of the diode 2 and the source electrode 19 of the MOSFET device 3 are both mounted on the first die support region 5 they are electrically connected at the same potential. The lower surface 9 of the first die support region 5 of the leadframe 4, therefore, provides a combined anode and source contact of the electronic component 1, denoted in FIG. 1 as A/S. The second die support region 6 provides the gate contact of the electronic component 1 which is denoted in FIG. 1 by G.

The contact clip 7 comprises a central web portion 23 and two peripheral rim portions 24. The flat web portion 23 is laterally generally rectangular and one peripheral rim portion 24 extends from each of the two opposing short sides of the rectangular flat web portion 23. The flat web portion has a lower surface 25 and an upper surface 26 which opposes the first surface. Each peripheral rim portion 24 extends downwards in a direction towards the lower surface 25 of the flat web portion 23 and towards the upper surface 8 of the leadframe 4.

Each peripheral rim portion extends into a foot region 27 which extends in a direction away from the leadframe 4 and the vertical semiconductor devices 2, 3. The lower surface 28 of the foot region 27 is generally coplanar with the lower surface 9 of the two die support regions 5,6 of the leadframe 4. The lower surface 28 of the region 27 upper contact clip 7, therefore, provides a surface mountable outer contact surface 10 of the electronic component 1. The flat web portion 23 is provided with a lateral area which is larger than the lateral area occupied by the diode 2 and MOSFET device 3 so that the diode 2 and MOSFET device 3 may be laterally accommodated within the volume created by the inner side walls 29 of the two peripheral rim portions 24. The two peripheral rim portions 24 extend for a distance so as to provide a height which is able to accommodate the height of the stack of the vertical semiconductor power devices 2, 3, the contact bumps 15 and the leadframe 4.

The lower surface 25 of the flat web portion 23 is mounted on the cathode electrode 14 of the diode 2 and on the drain electrode 21 of the MOSFET device 3 by a soft solder layer 30. The cathode electrode 14 and the drain electrode 21 are electrically connected to the contact clip 7 and are at same potential. The lower surface 28 of the two foot regions 27 of the contact clip 7, therefore, provide a combined drain and cathode outer contact which is denoted in FIG. 1 as D/K.

Figure 2:
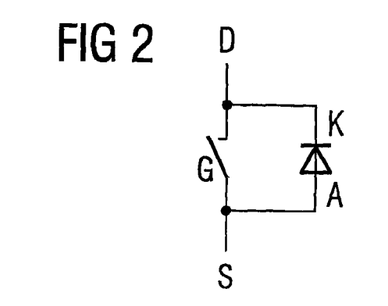
FIG. 2 illustrates the circuit provided by the electronic component of FIG. 1.

The electronic component 1 provides an electronic circuit with a MOSFET device 3 and a freewheeling diode die 2 connected in parallel with the MOSFET device 3. The circuit of the electronic component 1 shown in FIG. 1 is illustrated in FIG. 2.

The electronic component 1 was assembled by heating the leadframe 4 to a temperature above the melting point of the diffusion solder positioned on the outermost surface of the contact bumps 15 provided on the diode 2 and on the MOSFET device 3. The diode 2 was orientated above the upper surface 8 of the leadframe 4 with its first surface facing the upper face of the leadframe 4 and the diffusion solder layer brought into surface to surface contact with the upper surface 8 of the leadframe 4. Intermetallic phases form in the diffusion solder layer due to the reaction of the diffusion solder with the copper of the contact bump 15 and of the leadframe 4. The diode is mounted to the leadframe 4 by the solidification of the interface and the production of the diffusion solder bond 16. Similarly, the MOSFET device 3 was mounted so that the contact bump 15 positioned on the source electrode 19 is mounted by diffusion solder bond 16 on the first portion 5 of the leadframe 4 adjacent to the diode 2 and so that the contact bump 15 positioned on the gate electrode 20 is attached to the second die support region 6. The contact clip 7 is then attached to be cathode electrode 14 and drain electrode 21 on the opposing second sides of the diode 2 and MOSFET 3, respectively, by a solder joint.

Figure 3:
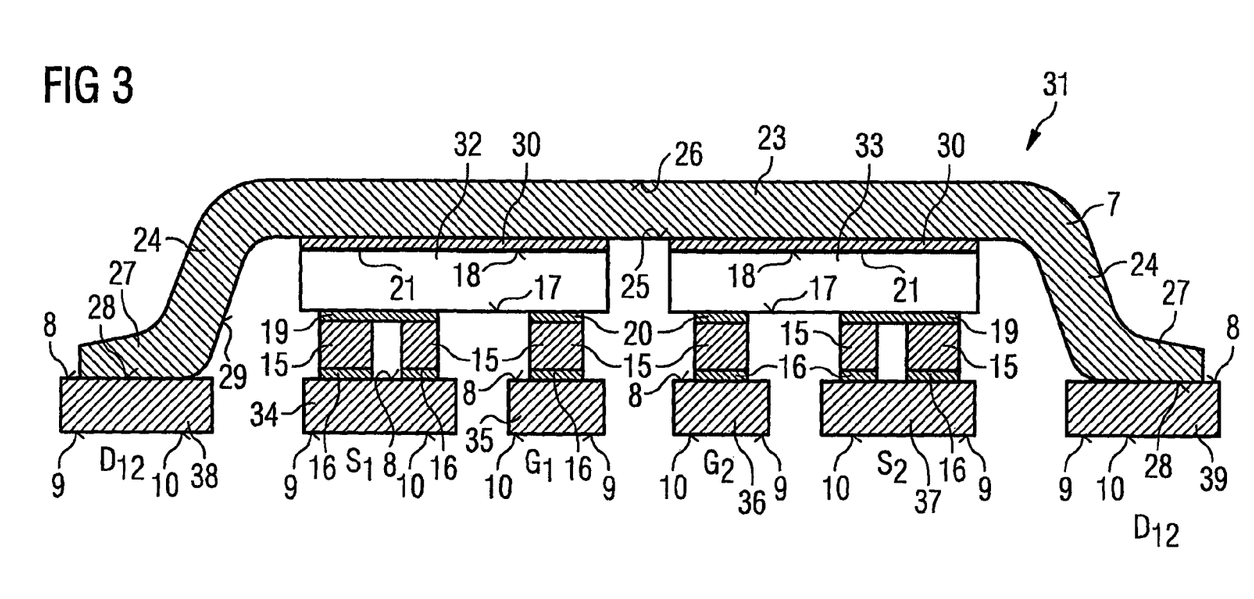
FIG. 3 illustrates an electronic component according to a second embodiment.

FIG. 3 illustrates an electronic component 31 according to a second embodiment. The electronic component 31 comprises two vertical MOSFET devices 32 and 33 in addition to a leadframe 4 and a contact clip 7. Parts of the electronic component 31 which are essentially the same, or perform the same function, as those illustrated for electronic component 1 in FIG. 1 are denoted by the same reference number and are not necessarily described in detail again.

In the second embodiment, the leadframe 4 comprises six die support regions 34, 35, 36, 37, 38, 39 which are physically separate from one another and are positioned adjacent one another.

The first MOSFET device 32 is an n-channel MOSFET device having first surface 17 which comprises a source electrode 19 and gate electrode 20 and a second surface 18 which comprises a drain electrode 21. A plurality of contact bumps 15 are provided on the source electrode 19 and a single contact bump 15 is provided on the gate electrode 20. The source electrode 19 is mounted on the upper surface 8 of a first portion 34 of the leadframe 4 and the gate electrode 20 is mounted by the contact bump 15 on a second portion 35 of the leadframe 4 which is positioned adjacent the first portion 34. The first MOSFET device 32 therefore extends between the first die support region 34 and second die support region 35 of the leadframe 4.

The first die support portion 34 of the leadframe 4 provides the source contact for the first MOSFET device 20 and is denoted as S1. The second die support portion 35 of the leadframe 4 provides the gate contact for the first MOSFET device 32 and is denoted G1 in FIG. 3.

The drain electrode 21 of the first MOSFET device 20 faces upwards away from the upper surface 8 of the leadframe 4. The first MOSFET device 32 is an n-channel device so that the source electrode is connected to ground potential and the drain electrode is connected to a high potential.

The second MOSFET device 33 is a p-channel MOSFET device. Similarly to the first MOSFET device 32, the second MOSFET device 33 comprises a first surface 17 which comprises a gate electrode 20 and source electrode 19 and second surface 18 which comprises a drain electrode 21. A single contact bump 15 is positioned on the gate electrode 20 and a plurality of contact bumps, of which two can be seen in view of FIG. 3, is positioned on the source electrode 20.

The second MOSFET device 33 is mounted on two portions 36, 37 of the leadframe 4 which are adjacent the first MOSFET device 32. The remaining two portions 38, 39 of the leadframe 4 are positioned in two opposing outermost regions of the leadframe 4. The two portions 36 and 37 of the leadframe 4 are positioned adjacent the portion 34 and 35. The gate electrode 19 of the second MOSFET device 33 is mounted on a third portion 36 of the leadframe 4 by the contact bump 15 and diffusion solder bond 16 and the source electrode 20 is mounted on the fourth portion 37 by the contact bumps 15 and their respective solder bonds 16. The second MOSFET device 33 therefore extends between the two die support regions 36, 37 of the leadframe 4.

The second MOSFET device 33 is a p-channel device so that the source electrode 20 connected to high potential and the drain electrode 21 is connected to a lower potential. The portion 36 of the leadframe 4, therefore provides the gate contact for the second MOSFET device 33 and is denoted G2 in FIG. 3. The fourth die support region 37 of the leadframe 4 provides the source contact for the second MOSFET device 33 and is denoted as S2 in FIG. 3. The two gate portions 35 and 36 of the leadframe 4 are positioned adjacent one another.

The contact clip 7 comprises a laterally rectangular flat web portion 23 and two peripheral rim portions 24 which extend from each of the two opposing short sides of the flat web portion 23. The flat web portion 23 is provided with a sufficient so that the two MOSFET devices 32, 33 may be mounted adjacent one another on the lower surface 25 of flat web portion 23 and be accommodated between the inner walls 29 of the two opposing peripheral portions 24. Therefore, the drain electrode 21 of first MOSFET device 32 and the drain electrode 21 of the second MOSFET device 33 are both electrically connected to the contact clip 7 and, therefore, are connected to the same potential.

The contact clip 7 in this embodiment of the invention differs from that shown in FIG. 1 in that the lower surface 28 of the foot regions 27 of the peripheral rim portions are positioned on the upper surface 8 of the two outermost portions 38, 39 of the leadframe 4. The lower surfaces 28 are mounted on the leadframe 4 by soft solder joints.

Figure 4:
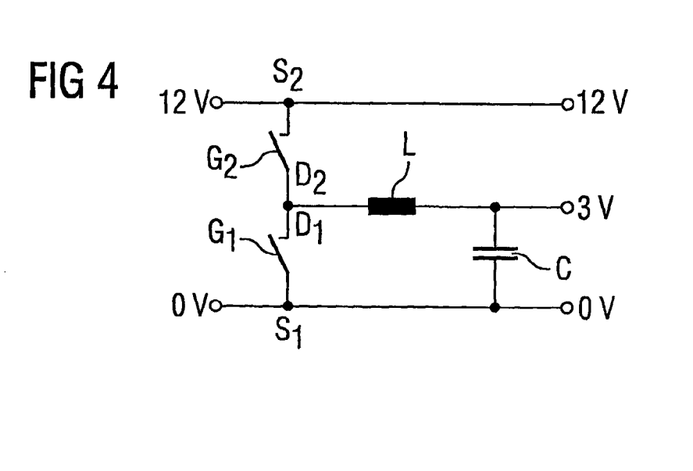
FIG. 4 illustrates the circuit provided by the electronic component of FIG. 2.

The electronic component 31, therefore, provides a half-bridge circuit as is illustrated in FIG. 4. The lower surfaces 9 of the two outermost portions 38, 39 of the leadframe 4 provide a drain contact for both the first MOSFET device 32 and second MOSFET device 33, denoted D12 in FIG. 3.

As is illustrated in the circuit in FIG. 4 of the electronic component 31, the electronic component 31 further comprises an impedance denoted L and a capacitance denoted C to complete the half-bridge circuit.

Figure 5:
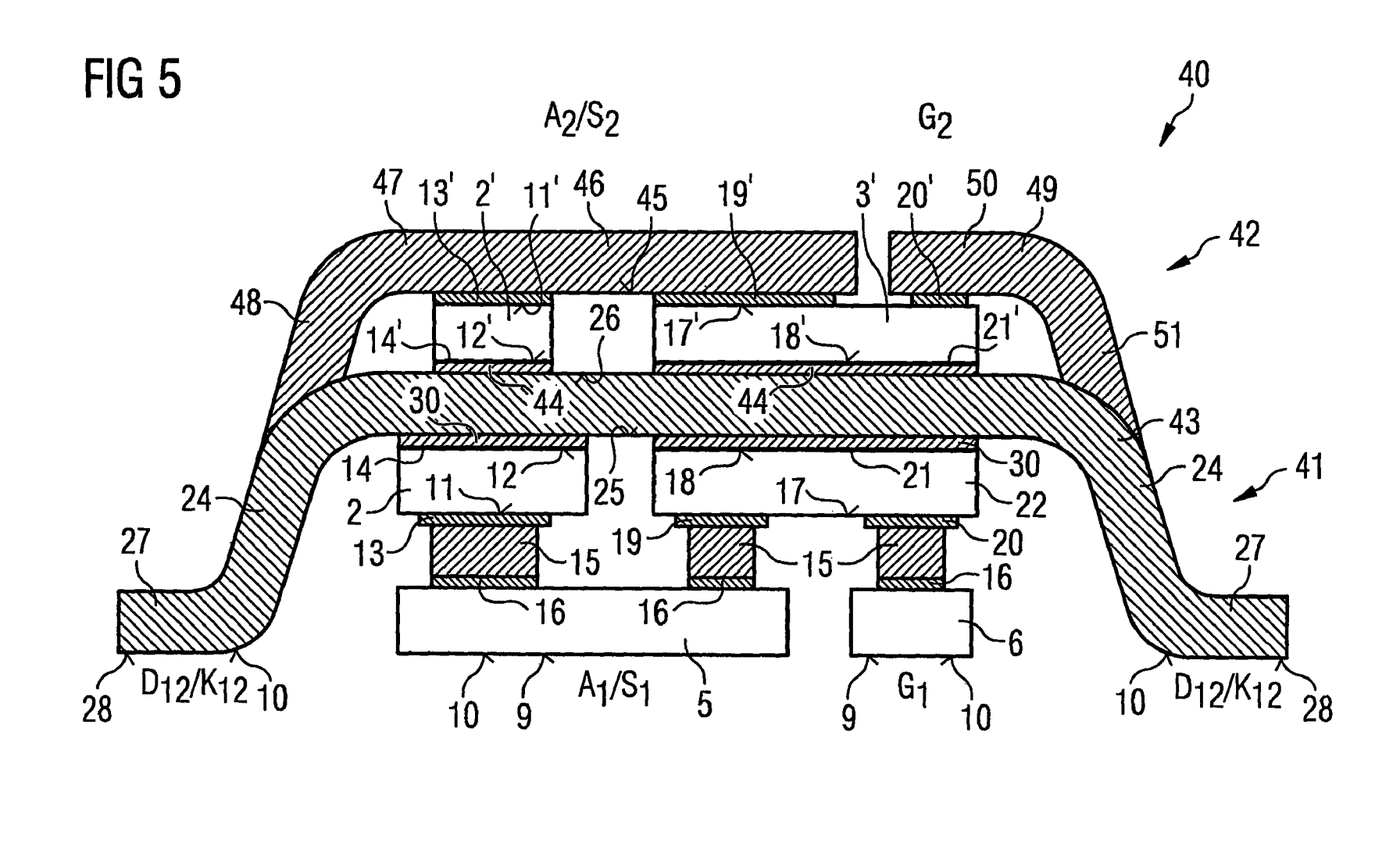
FIG. 5 illustrates an electronic component according to a third embodiment.

FIG. 5 illustrates an electronic component 40 according to a third embodiment. Electronic component 40 comprises a base component 41 and a stack component 42 positioned on the base component 41. The base component 41 comprises a leadframe 4, a diode 2, a MOSFET 3 and a base contact clip 43. The base component 41 has a similar arrangement to the electronic component 1 illustrated in FIG. 1. The base component 41 provides a MOSFET device 3 which is electrically connected in parallel with the diode 2.

The base contact clip 43 comprises an upper surface 26 and a lower surface 25 and two peripheral rim portions 24 which extend in a direction towards the upper surface 8 of the leadframe 4. Each peripheral rim portion extends into a foot region 27 which extends in a direction away from the side faces of the portion of the leadframe 4 to which it is adjacent. The lower surface 28 of each of the foot regions 27 provides a surface mountable outer contact surface 10 of the electronic component. The cathode 14 of the diode 2 and the drain electrode 21 of the MOSFET device 3 are mounted adjacent one another on the lower surface 25 of the base contact clip 43. The base contact clip 43 provides a shared electrical connection between the cathode of the diode 2 and the drain electrode 21 of the MOSFET device 3.

The stack component 42 of the electronic component 40 comprises a diode 2' and the MOSFET device 3'. The diode 2' has a first surface 11' which comprises an anode 13' and a second surface 12' which comprises a cathode 14'. The diode 2' of the stack component 42 is mounted on the upper surface 26 of the base contact clip 43 so that the cathode 14' is mounted on the upper surface 26 by a diffusion solder bond 44. In the stack component 42, the anode contact 13' faces upwards away from the leadframe 4. The cathode 14' is electrically connected to the base contact clip 43 and lies at the potential of the drain contact 21 and cathode contact 14 of the diode 2 and of the MOSFET 3, respectively, of the base component 41.

The stack component 42 also comprises a MOSFET device 3' comprising a first surface 17' which comprises a source electrode 19' and gate electrode 20' and a second surface 18' which comprises a drain electrode 21'.

The MOSFET device 3' of the stack component 42 is mounted with its drain electrode 21' on the upper surface 26 of the base contact clip 43. The drain electrode 21' of the MOSFET device 3 is electrically connected to the base contact clip 43 and lies at the same potential as the anodes of the diodes 2 of both the base component 41 and the stack component 42 and the drain electrode 21 of the base MOSFET 3. The lower surfaces 28 of the foot region 24 of the base contact clip 43, therefore, provide the drain contacts to each of the four vertical semiconductor components of the electronic component 40 and are denoted D12/K12.

The source electrode 19' of the MOSFET device 3' of the stack component 42 and the anode 13' of the diode 2' of the stack component 42 are mounted on the lower surface 45 of the flat web portion 46 of a first stack contact clip 47. The first stack contact clip 47 also comprises a peripheral rim portion 48 which extends in a direction from the lower surface 45 of the flat web portion 46 of the stack contact clip 47 towards the upper surface 48 of the leadframe 4. The peripheral rim portion 48 also extends into a foot region, which cannot be seen in the cross-sectional view of FIG. 5. The lower surface of the foot region is generally coplanar with the lower surface 28 of the foot region of the base contact clip 43 and with the lower surface 9 of the leadframe 4. The anode 13' of the diode 2' and the source electrode 19' of the MOSFET 3' of the stack component 42 are therefore electrically accessible by single contact from the surface mountable outer contacts areas 10 of the electronic component 40.

The arrangement of the first stack contact clip 47 and the base contact clip 41 provide a stack component 42 in which the diode 2' is electrically connected in parallel with the MOSFET device 3'. A second stack contact clip 49 is provided with a flat web portion 50 which is mounted on the gate 20 of the MOSFET device 3 of the stack component 42. Similarly to the first stack component 47, the second stack contact clip 49 includes a peripheral rim portion 41 which extends from an edge region of the flat web portion 50 in a direction towards the upper surface 8 of the leadframe 4 and ends in a foot region with lower surface which is generally coplanar with the lower surface of the foot regions of the base component 41 and with the lower surface 9 of the leadframe 4.

The electronic component 40, therefore provides a circuit in which the drain electrodes 21, 21' of the two power MOSFETs 3, 3' and the cathode electrodes 14, 14' of the two diodes 2, 2' are at the same potential.

The base contact clip 41 and stack contact clip is 47,49 may be provided with a form such that the foot regions of the contact clip is interleave with one each with each other to provide the electronic component having outer contact surfaces arranged in a row on two opposing sides of the electronic component 40. The base contact clip 41 and stack contact clip is 4749 may also be provided with a form such that the foot regions of the stack contact clips are arranged on two opposing sides of the electronic component 40 and the foot regions of the base contact clip are arranged on two opposing sides and between the foot regions of the stack contact clips. This embodiment, the electronic component 40 comprises outer contact regions on four sides of the rectangle.

The electronic component 40 may be assembled by firstly assembling the base component 41 in a similar fashion as that described for the electronic component 1 of FIG. 1. The two stack vertical electronic components 2', 3' may then be mounted on the upper surface 26 of the base contact clip 43 and then the first stack contact clips 47 attached to the anode 13' of the diode 2' and the source electrode 19' of the MOSFET device 3'. The second stack contact clip 49 attached to the gate electrode 20' of the MOSFET device 3'.

REFERENCE NUMBERS 1 first electronic component
2 2' diode
3 3' MOSFET
4 leadframe
5 first die support region
6 second die support region
7 contact clip
8 upper surface of leadframe
9 lower surface of leadframe
10 surface mountable outer contact surface
11 11' first surface of diode
12 12' second surface of diode
13 13' anode
14 14' cathode
15 contact bump
16 diffusion solder bond
17 17' first surface of MOSFET
18 18' second surface of MOSFET
19 19' source electrode
20 20' gate electrode
21 21' drain electrode
22 semiconductor body
23 flat web portion of contact clip
24 peripheral rim portion of contact clip
25 lower surface of flat web portion
26 upper surface of flat web portion
27 foot region
28 lower surface of the foot region
29 inner side wall
30 soft solder layer
31 second electronic component
32 first MOSFET device
33 second MOSFET device
34 first die support portion
35 second die support portion
36 third die support portion
37 fourth die support portion
38 first stack portion
39 second stack portion
40 third electronic component
41 base component
41 stack component
43 base contact clip
44 diffusion solder bond
45 lower surface of first stack contact clip
46 flat web portion of first stack contact clip
47 first stack contact clip
48 peripheral rim portion
49 second stack contact clip
50 flat web portion of second contact clip
51 peripheral rim portion

What is claimed is:

1. An electronic component, comprising:
   at least two vertical semiconductor power devices, each vertical semiconductor device comprising a first side and a second side opposing the first side, wherein at least one first load electrode is positioned on the first side and at least one second load electrode is positioned on the second side,
   an electrically conductive contact clip, the contact clip comprising a flat web portion and at least one peripheral rim portion extending from an edge region of the flat web portion in a direction towards the lower side of the flat web portion,
   a plurality of surface mountable outer contact surfaces,
   a leadframe comprising a lower surface providing surface mountable outer contact surfaces and an upper surface and providing at least two die support portions,
   wherein each of the at least two vertical semiconductor power devices is positioned between the upper surface of the leadframe and the lower surface of the flat web portion of the contact clip and is attached to, and electrically connected to, the upper surface of the leadframe and to the lower surface of the flat web portion of the contact clip.

2. An electronic component according to claim 1, wherein the second load electrode of each semiconductor power device is attached to the lower surface of the flat web portion of the contact clip and first side of each semiconductor power device is attached to the upper side of the leadframe.

3. An electronic component according to claim 2, wherein a first vertical semiconductor power device is one of the group consisting of a power MOSFET and an IGBT, the first side further comprising at least one control electrode, and wherein a second vertical semiconductor power device is one of the group consisting of a diode, a free-wheeling diode and a Schottky diode.

4. An electronic component according to claim 2, wherein the first vertical semiconductor power device is one of the group consisting of a power MOSFET and an IGBT and the second semiconductor power device is one of the group consisting of a power MOSFET and an IGBT, wherein the first side of the first vertical semiconductor power device further comprises at least one control electrode and the first side of the second semiconductor power device further comprises at least one control electrode.

5. An electronic component according to claim 4, wherein the first vertical semiconductor power device and the second vertical semiconductor power device are configured to provide a half-bridge circuit.

6. An electronic component according to claim 4, wherein the first vertical semiconductor power device is an n-channel device and the second vertical semiconductor power device is a p-channel device.

7. An electronic component according to claim 4, further comprising a Schottky diode.

8. An electronic component according to claim 7, wherein the Schottky diode is configured in parallel with the second vertical semiconductor power device.

9. An electronic component according to claim 1, wherein the contact clip comprises at least two peripheral rim portions, a peripheral rim portion extending from two opposing edge regions of the flat web portion, wherein each peripheral rim portion extends into a foot region, wherein the lower surface of the foot region of each of the peripheral rim portions provides a surface mountable outer contact surface.

10. An electronic component according to claim 1, wherein the contact clip comprises at least two peripheral rim portions, a peripheral rim portion extending from two opposing edges regions of the flat web portion, wherein each peripheral rim portion extends into a foot region, wherein the leadframe further comprises two outer portions, and wherein the foot region of one peripheral rim portion is attached and electrically connected to each outer portion of the leadframe.

11. An electronic component comprising a base component and at least one stack component, wherein the base component comprises:
at least two base vertical semiconductor power devices, each base vertical semiconductor device comprising a first side and a second side opposing the first side, wherein at least one first load electrode is positioned on the first side and at least one second load electrode is positioned on the second side,
an electrically conductive base contact clip, the base contact clip comprising a base flat web portion and at least one base peripheral rim portion, wherein the base flat web portion has a lower side and an upper side, wherein a base peripheral rim portion extends from an edge region of the base flat web portion in a direction towards the lower side of the base flat web portion,
a plurality of surface mountable outer contact surfaces, wherein each of the at least two base vertical semiconductor power devices is attached to, and electrically connected to, the lower surface of the base flat web portion of the base contact clip,
and wherein the stack component comprises:
at least two stack vertical semiconductor power devices, each stack vertical semiconductor device comprising a first side and a second side opposing the first side, wherein at least one first load electrode is positioned on the first side and at least one second load electrode is positioned on the second side,
wherein each of the stack vertical semiconductor power devices is attached to, and electrically connected to, the upper surface of the base contact clip of the base component.

12. An electronic component according to claim 11, wherein
the second load electrode of each of the stack vertical semiconductor power devices is mounted on the upper surface of the base flat web portion of the base contact clip and wherein the first load electrode of each of the stack vertical semiconductor power devices are electrically accessible from the surface mountable outer contact surfaces of the base component.

13. An electronic component according to claim 12, wherein
further comprising at least two stack contact clips, each stack contact clip comprising a flat web portion and a peripheral rim portion extending from one edge region of the flat web portion in a direction towards the lower surface of the flat web portion.

14. An electronic component according to claim 13, wherein
each stack peripheral rim portion extends into a foot region, wherein the lower surface of the foot region of each of the stack peripheral rim portions provides a surface mountable outer contact surface.

15. An electronic component according to claim 11, wherein
the base component further comprises a leadframe comprising a lower surface providing surface mountable outer contact surfaces, an upper surface and at least two die support portions, wherein the at least two base vertical semiconductor power devices are mounted on, and electrically connected to, the upper surface of the die support portions of the leadframe.

16. An electronic component according to claim 13, wherein
each stack peripheral rim portion extends into a foot region, and wherein a leadframe is provided which further comprises two outer portions, one foot region of a stack peripheral rim portion being attached and electrically connected to each outer portion of the leadframe.

17. An electronic component according to claim 11, wherein
a first base vertical semiconductor power device is one of the group consisting of a power MOSFET and an IGBT and the first side further comprises at least one control electrode and a second base vertical semiconductor power device is one of the group consisting of a diode, a free-wheeling diode and a Schottky diode.

18. An electronic component according to claim 17, wherein
a first stack vertical semiconductor power device is one of the group consisting of a power MOSFET and an IGBT and the first side further comprises at least one control electrode and a second stack vertical semiconductor power device is a one of the group consisting of a diode, a free-wheeling diode and a Schottky diode.

19. An electronic component according to claim 11, wherein a first base vertical semiconductor power device is one of the group consisting of a power MOSFET and an IGBT, first side further comprising at least one control electrode, and wherein a second base vertical semiconductor power device is one of the group consisting of a power MOSFET and an IGBT, the first side further comprising at least one control electrode.

20. An electronic component according to claim 19, wherein a first stack semiconductor power device is one of the group consisting of a power MOSFET and an IGBT and a second stack semiconductor power device is one of the group consisting of a power MOSFET and an IGBT, wherein the first side of the first stack semiconductor power device and the first side of the second stack semiconductor power device further comprises at least one control electrode.

21. A method comprising:

providing at least two base vertical semiconductor power devices, each base vertical semiconductor device comprising a first side and a second side opposing the first side, wherein at least one first load electrode is positioned on the first side and at least one second load electrode is positioned on the second side, providing an electrically conductive base contact clip, the base contact clip comprising a base flat web portion and at least one base peripheral rim portion, wherein the base flat web portion has a lower side and an upper side, wherein a base peripheral rim portion extends from an edge region of the base flat web portion in a direction towards the lower side of the base flat web portion, a plurality of surface mountable outer contact surfaces, attaching and electrically connecting each of the at least two base vertical semiconductor power devices to the lower surface of the base flat web portion of the base contact clip, providing at least two stack vertical semiconductor power devices, each stack vertical semiconductor device comprising a first side and a second side opposing the first side, wherein at least one first load electrode is positioned on the first side and at least one second load electrode is positioned on the second side, attaching and electrically connecting each of the stack vertical power devices to the upper surface of the base contact clip of the base component.

22. A method according to claim 21, wherein the second load electrode of each of the base vertical semiconductor devices is attached to the lower surface of the flat web portion of the base contact clip and wherein the second load electrode of each of the stack vertical semiconductor devices is attached to the upper surface of the flat web portion of the base contact clip.

23. A method according to claim 22, wherein the second load electrode of each of the base vertical semiconductor devices is attached to the lower surface of the flat web portion of the base contact clip by a diffusion solder process and wherein the second load electrode of each of the stack vertical semiconductor devices is attached to the upper surface of the flat web portion of the base contact clip by a diffusion solder process.

24. A method according to claim 22, wherein a leadframe is provided, the leadframe comprising a lower surface providing surface mountable outer contact surfaces and an upper surface and at least two die support portions, wherein the base vertical semiconductor power devices are attached and electrically connected to the upper surface of the die support portions.

25. A method according to claim 22, wherein at least two stack contact clips are provided, each stack contact clip comprising a flat web portion and a peripheral rim portion extending from one edge region of the flat web portion in a direction towards the lower surface of the flat web portion, wherein a stack contact clip is mounted on at least the first load electrode of the first and second stack vertical semiconductor power devices and wherein the first load electrode of the first and second vertical semiconductor power devices are electrically accessible from surface mountable outer contact surfaces of the electronic component.

* * * * *